United States Patent [19]

Akasaka et al.

[11] 4,441,932
[45] Apr. 10, 1984

[54] PROCESS FOR PREPARING SEMICONDUCTOR DEVICE HAVING ACTIVE BASE REGION IMPLANTED THEREIN USING WALLED EMITTER OPENING AND THE EDGE OF DIELECTRIC ISOLATION ZONE

[75] Inventors: Yoichi Akasaka; Katsuhiro Tsukamoto, both of Itami, Japan

[73] Assignee: Mitsubishi Denki Kabushiki Kaisha, Tokyo, Japan

[21] Appl. No.: 357,299

[22] Filed: Mar. 11, 1982

[30] Foreign Application Priority Data

Mar. 11, 1981 [JP] Japan .................. 56-36096

[51] Int. Cl.³ .................. H01L 21/265; H01L 21/225; H01L 21/26
[52] U.S. Cl. .................. 148/1.5; 29/571; 29/576 B; 148/187; 357/34; 357/91
[58] Field of Search .................. 148/1.5, 187; 29/571, 29/576 B; 357/34, 91

[56] References Cited

U.S. PATENT DOCUMENTS

| | | | |
|---|---|---|---|
| 4,066,473 | 1/1978 | O'Brien | 148/1.5 |
| 4,175,983 | 11/1979 | Schwabe | 148/1.5 |
| 4,191,595 | 3/1980 | Aomura et al. | 148/1.5 |
| 4,199,380 | 4/1980 | Farrell et al. | 148/1.5 |
| 4,231,819 | 11/1980 | Raffel et al. | 148/175 |
| 4,242,791 | 1/1981 | Horng et al. | 29/578 |
| 4,313,255 | 2/1982 | Shinozaki et al. | 29/576 B |
| 4,333,774 | 6/1982 | Kampka | 148/1.5 |
| 4,338,138 | 7/1982 | Cavaliere et al. | 148/1.5 |
| 4,372,030 | 2/1983 | Saitoh | 29/576 B |

OTHER PUBLICATIONS

Gaur et al., IBM-TDB, 23, (1980), 1895.
Akasaka et al., Technical Digest of IEDM 1979, p. 189.

*Primary Examiner*—Upendra Roy
*Attorney, Agent, or Firm*—Oblon, Fisher, Spivak, McClelland & Maier

[57] ABSTRACT

A process for preparing a semiconductor device having a walled emitter structure covering at least one side surface with a dielectric layer for separation of devices comprises a step of forming a base by implantation of ions with a resist mask for base; a step of forming an emitter by implantation of ions from an emitter-opening part; and a step of formation an active base in a base just below said emitter by implantation of ions from said emitter-opening part.

1 Claim, 24 Drawing Figures

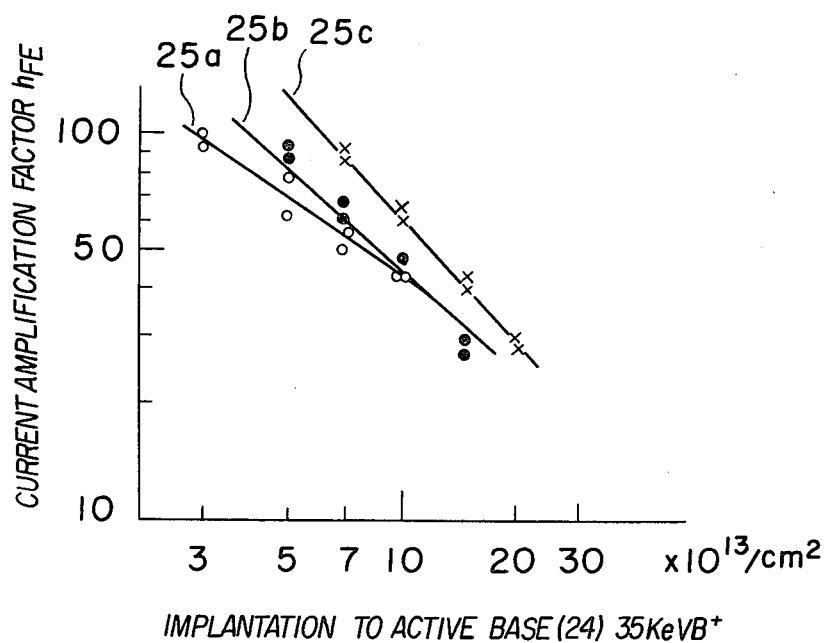

PROCESS FOR PREPARING SEMICONDUCTOR DEVICE HAVING ACTIVE BASE REGION IMPLANTED THEREIN USING WALLED EMITTER OPENING AND THE EDGE OF DIELECTRIC ISOLATION ZONE

BACKGROUND OF THE INVENTION

1. Field of the Invention

The present invention relates to a process for preparing a semiconductor device having a walled emitter structure covering at least one side surface with a dielectric layer for separation of devices.

2. Description of the Prior Art

FIGS. 1(a)-1(f) are sectional views showing steps of preparation of an oxide layer separation type bipolar IC prepared by the conventional process for preparing a semiconductor device. In FIG. 1, the reference (1) designates a p-substrate; (2) designates an embedded collector formed in the p-substrate (1); (3) designates an oxide layer; (4) designates an n-epitaxial layer; (5) designates a separating oxide layer for separation of devices obtained by selective oxidation; (6) designates a field doped layer made of p+-layer for prevention of field turn-over formed by implantation of boron ions into a filed part followed by selective oxidation; (7) designates a surface protective oxide layer having relatively thin thickness such as 1000 Å; (8) designates implanted phosphorus ions; (9) designates a resist mask for collector wall; (10) designates a collector wall; (11) designates a resist mask for base formed by photo-engraving; (12) designates implanted boron ions; (13) designates a base; (14a) designates an emitter-opening part; (14b) designates a base-opening part; (14c) designates a collector-opening part; (15) designates a resist mask for emitter; (16) designates implanted arsenic ions; (17) designates an edge of the separating oxide layer; (18) designates a surface protective oxide layer having relatively thick thickness such as 4000 Å; (19) designates an emitter; (20) designates an emitter wiring; (21) designates a base wiring; and (22) designates a collector wiring.

The process for preparing the semiconductor device having the aforementioned structure will be illustrated. As shown in FIG. 1(a), the embedded collector (2) is formed in the p-substrate (1) by thermal diffusion or ion implantation of As or Sb to perform the doping and the elongating diffusion. As shown in FIG. 1(b), the surface oxide layer (3) is removed and n-epitaxial layer (4) is grown and the separating oxide layer (5) for separation of devices is formed by the selective oxidation in the selective oxidation step. Before the selective oxidation, boron ions are implanted into the field part to form the field doped layer (6) made of p+-layer for prevention of field turn-over. As shown in FIG. 1(c), the surface protective oxide layer (7) having relatively thin thickness such as 1000 Å is formed and then the opening part of the collector wall is formed by a photo-engraving and the phosphorus ions (8) are implanted with the resist mask (9) for collector wall. As shown in FIG. 1(d), the collector wall (10) is formed. Then, the resist mask (11) for base is formed by a photo-engraving and the boron ions (12) are implanted. As shown in FIG. 1(e), the base (13) is formed. Then, the emitter opening part (14a), the base opening part (14b) and the collector opening part (14c) are opened. The emitter opening part (14a) and the collector opening part (14c) are not covered, but the base opening part (14b) is covered with the resist mask (15) and the emitter and the arsenic ions (16) are implanted. As shown in FIG. 1(f), the emitter (19) is formed. Then, the resist is removed and the emitter wiring (20) and the base wiring (21) and the collector wiring (22) are formed by the metallization. After the step, the passivation or the multilayer wiring step is given by a suitable device.

When the semiconductor device having the walled emitter structure having an emitter whose at least one side surface is covered by a separating oxide layer is prepared, by the conventional process, the structure of the edge (17) of the separating oxide layer (5) and the edge (17) of the emitter opening part (14a) as the mask in the etching of the oxide layer in the formation of the emitter part (14a) and the other opening parts, is different in the implantation of the boron ions (12) for forming the base (13) from the implantation of the arsenic ions (16) for forming the emitter (19). Therefore, as shown in FIG. 2, the base junction is thin in the edge (17) of the separating oxide layer (5) whereas the emitter junction is deep whereby there is disadvantage of easy formation of shortcircuit of emitter-collector caused by passing through the emitter at the part (shown by the circular dotted line in FIG. 2).

SUMMARY OF THE INVENTION

It is an object of the present invention to provide a process for preparing a semiconductor which can prevent a emitter-collector shortcircuit which is easily caused in a walled emitter structure.

The foregoing and other objects of the present invention have been attained by providing a process for preparing a semiconductor device having a walled emitter structure covering at least one side surface with a dielectric layer for separation of devices which comprises a step of forming a base by implantation of ions with a resist mask for base; a step of forming an emitter by implantation of ions from an emitter-opening part; and a step of forming an active base in a base just below said emitter by implantation of ions from said emitter-opening part.

BRIEF DESCRIPTION OF THE DRAWINGS

FIG. 6 shows characteristics of transistors having the walled emitter structure obtained by the steps of FIGS. 3(a)-3(g) and 4(a)-4(g).

DETAILED DESCRIPTION OF THE PREFERRED EMBODIMENTS

Figure 1:
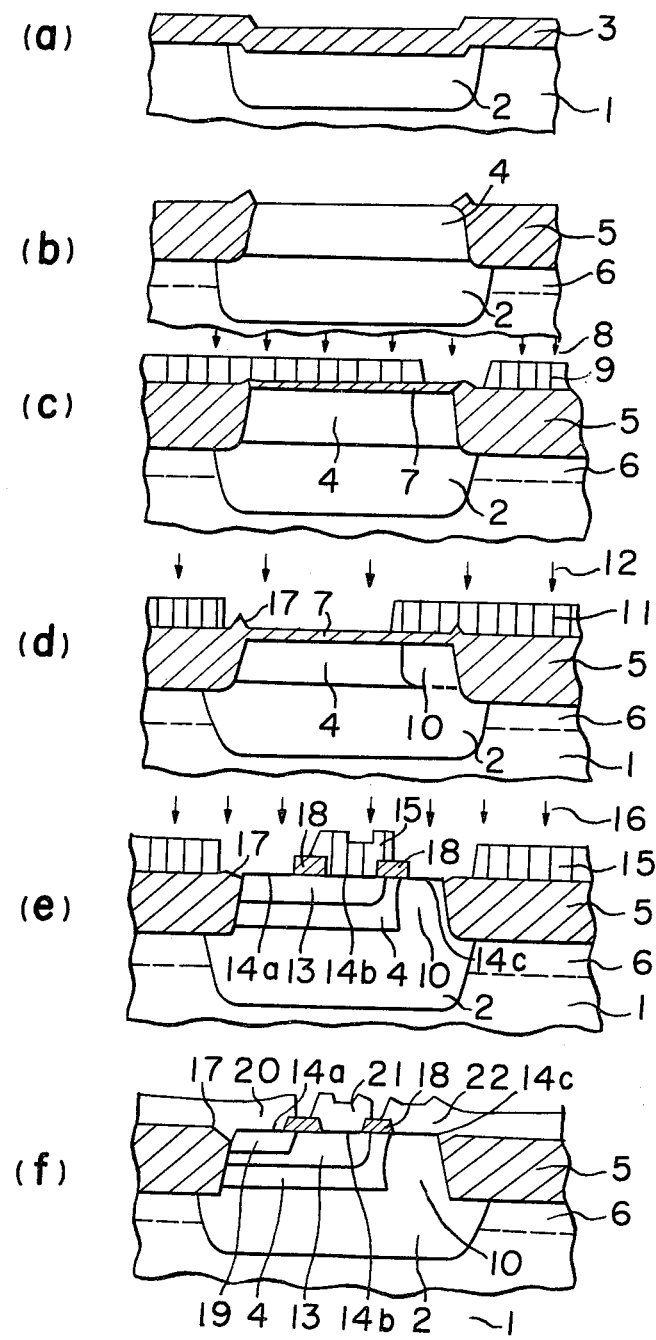
FIGS. 1(a)-1(f) are sectional views showing steps in the conventional process for preparing a semiconductor device.
Figure 2:
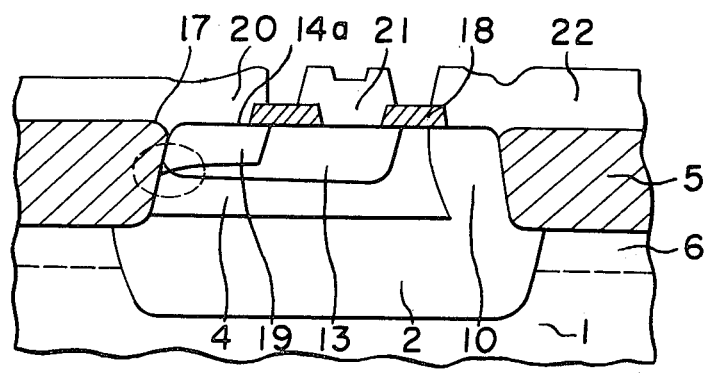
FIG. 2 is a sectional view of an enlarged part for illustrating the steps of FIGS. 1(a)-1(f)

FIGS. 3(a)-3(g) are sectional views showing steps of one embodiment of the preparation of a semiconductor device according to the present invention. In FIGS. 3(a)-3(g), the reference (23) designates a resist mask for base which is an over-size mask whereby an active base (24) is formed by implantation of boron ions corresponding to the shape of the emitter-opening part (14a) and the edge (17) of the separating oxide layer (5).

The preparation of the semiconductor device having the aforementioned structure will be illustrated.

Figure 3:
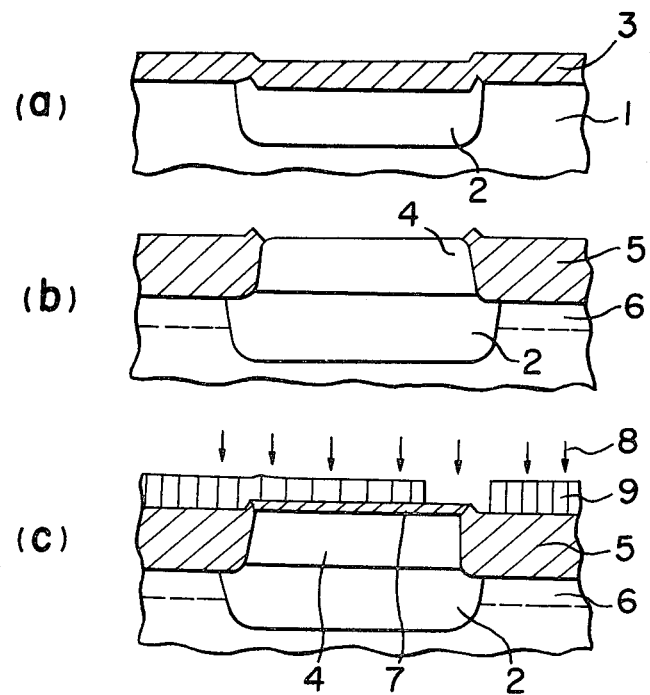
FIGS. 3(a)-3(g) are sectional views showing steps in one embodiment of the process for preparing a semiconductor device according to the present invention.
Figure 3:
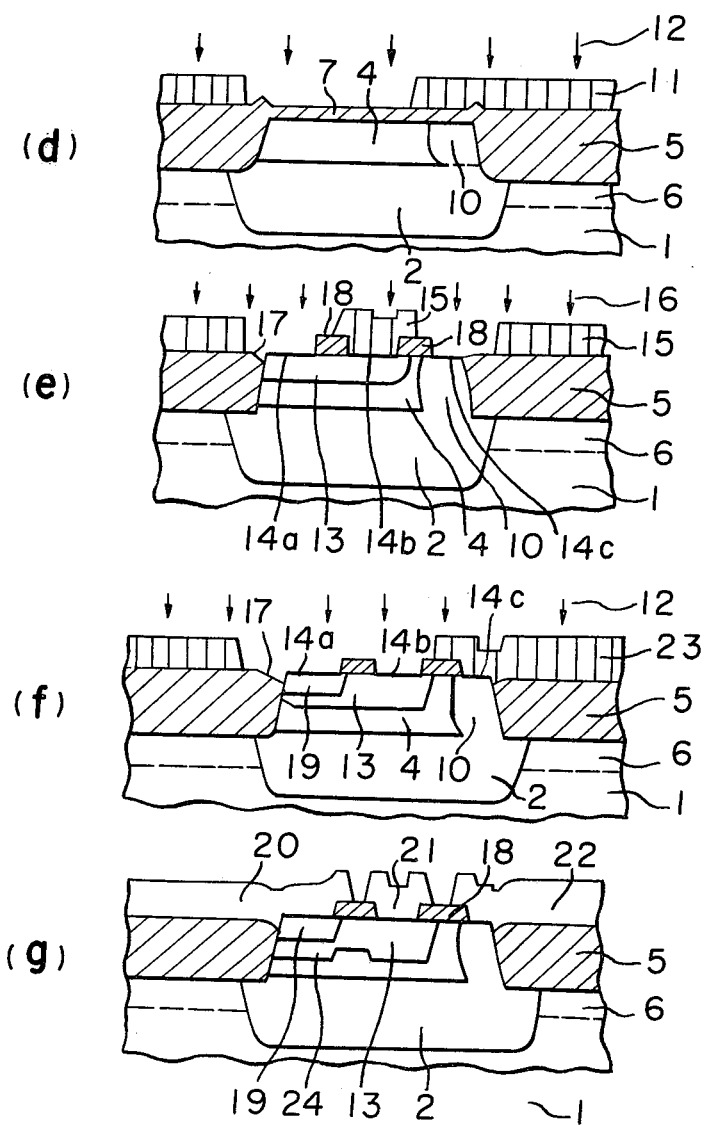

As shown in FIG. 3(a), the embedded collector (2) is formed in the p-substrate (1) by doping As or Sb by the thermal diffusion or the implantation of ions in the elongated diffusion. As shown in FIG. 3(b), the surface oxide layer (3) is removed and the n-epitaxial layer (4) is grown and then, the separating oxide layer (5) for separation of devices is formed by the selective oxidation. Before the selective oxidation, the boron ions are implanted into the field part to form the field doped layer (6) made of the p+-layer for prevention of field turnover during the selective oxidation. As shown in FIG. 3(c), the surface protective layer (7) having a relatively thin thickness such as 1000 Å is formed and then, the opening part is formed in the collector wall by the photo-engraving. The phosphorus ions (8) are implanted with the resist mask (9) for the collector wall. As shown in FIG. 3(d), the collector wall (10) is formed. Then, the resist mask (11) for base is formed by the photo-engraving and the boron ions (12) are implanted. As shown in FIG. 3(e), the base (13) is formed. Then, the emitter opening part (14a), the base opening part (14b) and the collector-opening part (14c) are formed. The arsenic ions (16) are implanted with the resist mask (15) for emitter under covering only the base-opening (14b) without covering the emitter opening part (14a) and the collector opening part (14c). As shown in FIG. 3(f), the emitter (19) is formed. The boron ions (12) are implanted with the resist mask for base (23). In this case, the resist mask for base (23) is the over-size mask. The boron ions are implanted corresponding to the shape of the emitter opening part (14a) and the edge (17) of the separating oxide layer (5). Therefore, as shown in FIG. 3(g), the active base (24) is formed. As a result, the base of the practical device is the combination of the base (13) and the active base (24). The resist is removed and the emitter wiring (20), the base wiring (21) and the collector wiring (22) are formed by the matallization. After the steps, the passivation or the multi-layer wiring step is performed by a suitable device.

It is possible to carry out the annealing step after implantation of ions in the reverse order of the step shown in FIG. 3(e) and the step shown in FIG. 3(f).

FIGS. 4(a)–4(g) are sectional views showing steps of the other embodiment of the preparation of the semiconductor device according to the present invention.

Figure 4:
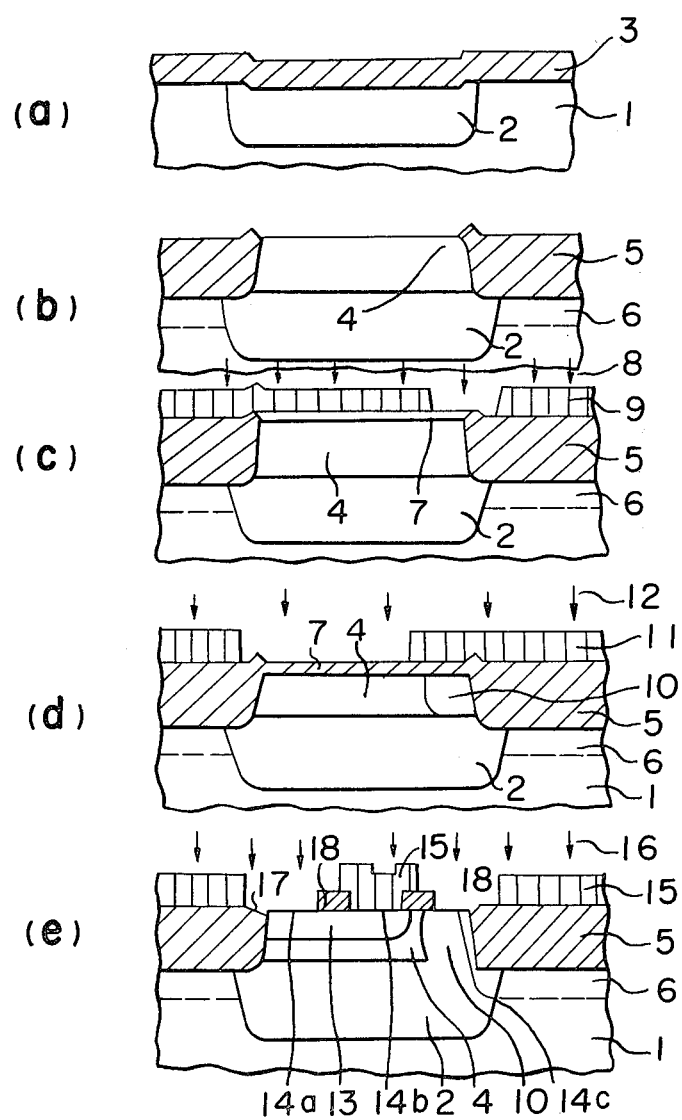
FIGS. 4(a)-4(g) are sectional views showing steps in the other embodiments of the process for preparing a semiconductor device according to the present invention.
Figure 4:
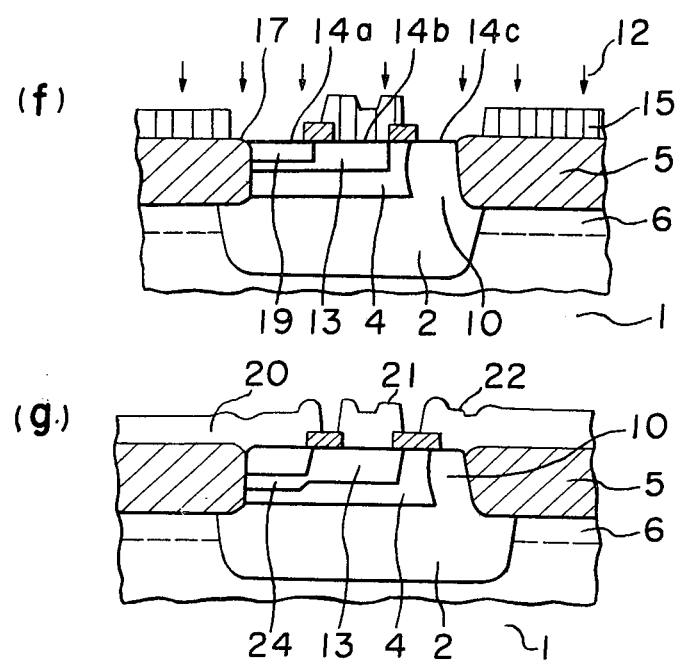
Figure 5:
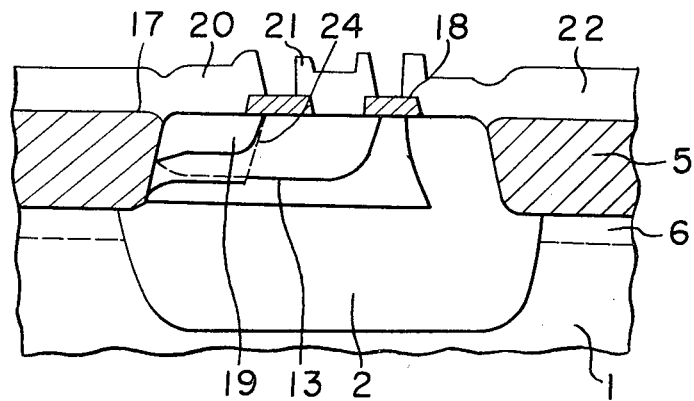
FIG. 5 is a sectional view of an enlarged part for illustrating the steps of FIGS. 3(a)-3(g) or FIGS. 4(a)-4(g)

The steps are similar to those of FIGS. 3(a)–3(g). As shown in FIG. 4(f), the emitter (19) is formed by implantation of the boron ions (12) with the resist mask for emitter (15) which was used for the implantation of the arsenic ions (16). The boron ions (12) are substantially implanted into the emitter part (19) and the collector part (2), however, the active base (24) is formed only just below the emitter because of the presence of the collector wall (10). It is, of course, possible to reverse the order of the step shown in FIG. 4(e) and the step shown in FIG. 4(f), in the implantation of the ions. The sectional structure of the implantation shown in FIG. 5 is formed at the part contacting the separating oxide layer with the emitter-base junction by the implantation of the boron ions just below the emitter. Therefore, it gives the base (13) formed along the edge of the separating oxide layer before the etching of the oxide layer and the active base (24) formed along the edge of the separating oxide layer after the etching of the oxide layer. The active base (24) is formed by implantation through the edge (17) of the same separating oxide layer (5) of the emitter (19) and the emitter-opening part (14a) whereby the shape of the junction near the edge (17) is a similar figure. Therefore, the emitter-collector short-circuit and the leakage can be prevented. Even though the semiconductor device having the walled emitter structure is produced, the yield of effective junction is remarkably high.

FIG. 6 shows characteristics of transistors having the walled emitter structure prepared by the steps shown in FIGS. 3(a)–3(g) or FIGS. 4(a)–4(g); as one example, shows the relation of the implantation (implantation energy of 35 KeV) in the active base (24) under the condition of the implantation to the base (13) of 50 KeV and $3-7\times10^{13}/cm^2$ and the current amplification factor $h_{FE}$ of the resulting transistor. In this case, the arsenic ions are implanted into the emitter under the condition of 150 KeV and $4\times10^{15}/cm^2$. A desired current amplification factor $h_{FE}$ is given by the combination of the condition of implantation for the base (13) and the active base (24). This is effective for broad process conditions. In FIG. 6, the linear line (25a) is given in the case of the implantation to the base (13) of $7\times10^{13}/cm^2$; and the linear line (25b) is given in the case of the implantation to the base (13) of $5\times10^{13}/cm^2$ and the linear line (25c) is given in the case of the implantation to the base (13) of $3\times10^{13}/cm^2$.

As described in detail, in accordance with the process for preparing the semiconductor device of the present invention, the emitter-collector shortcircuit and leakage can be effectively prevented, whereby the yield of effective junction is advantageously high even though it has the walled emitter structure.

We claim:

1. In a method of preparing a semiconductor device having a walled emitter structure covering at least one side surface with a dielectric layer for separation of a plurality of said devices wherein a collector is formed in a substrate by doping through the use of one of thermal diffusion and implantation of ions and wherein a surface oxide layer covering said collector and said substrate is removed with a epitaxial layer being grown on said collector and whereby said layer for separating each of a plurality of said devices is formed by selective oxidation and wherein a collector wall is formed by implantation of phosphorus ions through a first resist mask having an opening for forming said collector wall, the improved method comprising the steps of:
   forming a base by implantation of ions with a second resist mask with an opening to obtain a base;
   forming an emitter area by implantation of ions with a third resist mask having an emitter-opening portion and a collector-opening portion;
   forming an active base just below said emitter by implantation of ions through said emitter-opening portion and an edge of said separating oxide layer through the use of a fourth resist mask which is an over-size mask.

* * * * *